(12) United States Patent
Koch et al.

(10) Patent No.: US 7,268,364 B2
(45) Date of Patent: Sep. 11, 2007

(54) HYBRID DEVICES

(75) Inventors: Norbert Koch, Berlin (DE); Hisao Ishii, Sendai (JP)

(73) Assignee: Aculon, Inc., San Diego, CA (US)

( * ) Notice: Subject to any disclaimer, the term of this patent is extended or adjusted under 35 U.S.C. 154(b) by 141 days.

(21) Appl. No.: 11/233,890

(22) Filed: Sep. 23, 2005

(65) Prior Publication Data
US 2007/0069246 A1    Mar. 29, 2007

(51) Int. Cl.
*H01L 35/24* (2006.01)
(52) U.S. Cl. .................. 257/40; 257/21; 257/431; 257/E45.002; 977/827
(58) Field of Classification Search ............. 257/40
See application file for complete search history.

(56) References Cited

U.S. PATENT DOCUMENTS

2004/0159835 A1* 8/2004 Krieger et al. ............. 257/40

* cited by examiner

*Primary Examiner*—Tu-Tu V. Ho
(74) *Attorney, Agent, or Firm*—William J. Uhl

(57) ABSTRACT

Hybrid devices, such as optically erasable memory cells and light sensors, and related methods are disclosed. In some embodiments, a device includes a structure capable of converting between a first resistance state and a second resistance state, and a light source configured to convert the structure from the first resistance state to the second resistance state. The structure includes an organic first material and a second material different from the first material.

28 Claims, 2 Drawing Sheets

HYBRID DEVICES

TECHNICAL FIELD

The invention relates to hybrid devices, such as optically erasable memory cells and light sensors.

BACKGROUND

One example of a hybrid device is a bistable device that contains two or more material compositions. A bistable device is capable of exhibiting two states of different electrical resistances by application of a predetermined voltage, and until the predetermined voltage is applied, the device is capable of retaining its present electrical resistance. This electrical bistability allows a bistable device to be used for switching and memory applications. For example, for memory applications, a memory input can be written to the bistable device by applying a positive voltage to the device to convert the device from a first resistance state (e.g., high resistance) to a second resistance state (e.g., low resistance). The resistance of the device can be measured to determine which state the device is in. To erase the memory input, a negative voltage can be applied to the device to convert the device from the second resistance state to the first resistance state.

FIG. 1 shows an embodiment of a bistable device 20. Device 20 includes a structure 22 and a electrical power source 24 in electrical communication with the structure. Structure 22 includes a first electrode 26 and a second electrode 28 in electrical communication with electrical power source 24 via connections 30, 32, respectively. Between electrodes 26, 28 structure 22 includes a hybrid blend 34 containing particles (e.g., aluminum) in an organic material (e.g., 2-amino-4,5-imidazoledicarbonitrile). In some embodiments, the particles can be in the form of a layer in the organic material. Blend 34 is capable of exhibiting two states of different electrical resistances. For example, the resistance state of blend 34 can be changed from a first resistance state to a second resistance state by applying a predetermined voltage to electrodes 26, 28 via electrical power source 24. To convert from the second resistance state to the first resistance, an opposite, predetermined voltage can be applied. Bistable devices are described, for example, in Yang et al., U.S. Patent Application Publication No. 2004/0027849.

SUMMARY

The invention relates to hybrid devices.

In one aspect, the invention features devices (such as bistable devices) that can be electrically converted from a first state of resistance to a second state of resistance, and optically converted from the second state of resistance to the first state of resistance. The devices can be used in a number of applications, such as optically erasable memory cells, light sensors, and multi-level data storage (e.g., in combination with organic-based (opto-) electronic devices, such as light emitting diodes, thin film transistors, and photovoltaic cells). Changing (e.g., erasing) information stored in the bistable devices by optical irradiation may allow electronic and photonic information processing architectures to be integrated on the same platform. The devices can be formed with good mechanical flexibility at low production costs In another aspect, the invention features a device including a structure capable of converting between a first resistance state and a second resistance state, the structure having an organic first material and a second material different from the first material; and a light source configured to convert the structure from the first resistance state to the second resistance state.

Embodiments may include one or more of the following features. The structure further includes a first electrode and a second electrode, the first and second materials being between the first and second electrodes. The first material includes a conjugated organic material, such as diindenoperylene, p-sexiphenyl, oligophenylenes, polyphenylenes, diindenoperylene (DIP), perylene derivatives, oligothienylenes, polythienylenes, phthalocyanines, porphyrines, oligophenylenevinylenes, polyphenylenevinylenes, oligofluorines, polyfluorines, N,N'-bis-(1-naphthyl)-N,N'-diphenyl 1-1,1-biphenyl 1-4,4'-diamine (and derivatives or polymeric analogs), monoarenes, polyarenes, oligoarenes, and/or co-polymers thereof. The second material includes a metal, a semiconductor, or a mixture thereof. The second material is selected from the group consisting of gold, aluminum, copper, silver, titanium, platinum, samarium, a group IV semiconductor, a III-V semiconductor, a II-VI semiconductor, and a composite semiconductor. The second material is in the form of one or more particles. The second material has an average width or diameter of from approximately 5 Angstroms to approximately 50 nanometers. The second material includes a first composition and a second composition, the first composition being selected from the group consisting of a metal, a semiconductor, and a mixture thereof, and the second composition being selected from an insulator and an organic material. The second material is in the form of one or more layers. The second material is encapsulated by the first material. The second material includes at least two different chemical compositions. The second material includes an insulator or an organic material. The structure further includes a first electrode and a second electrode, the first and second materials are in the form of layers, the first material being between the second material and one of the electrodes. The light source is capable of providing light having a wavelength from approximately 420 nanometers to approximately 1,600 nanometers. The device is in the form of a non-volatile memory cell or a light sensor.

In another aspect, the invention features a device including a structure capable of converting between a first resistance state and a second resistance state, the structure having a first electrode, a second electrode, an organic material between the first and second electrodes, and one or more particles between the first and second electrodes, the one or more particles having a different composition from the organic material; and a light source configured to convert the structure from the first resistance state to the second resistance state, the light source being capable of providing light having a wavelength from approximately 420 nanometers to approximately 1,600 nanometers.

Embodiments may include one or more of the following features. The one or more particles are in the form of one or more layers. The one or more particles are encapsulated by the organic material. The one or more particles include a core having a first composition, and a layer having a second composition different from the first composition. The organic material includes a conjugated organic material. The device further includes a second device capable of providing an electrical voltage across the first and second electrodes. The device is in the form of a non-volatile memory cell or a light sensor.

In another aspect, the invention features a method of using a device including providing a structure capable of converting between a first resistance state and a second resistance state, the structure including an organic first material and a second material different from the first material; and addressing the structure with light sufficient to convert the structure from the first resistance state to the second resistance state.

Embodiments may include one or more of the following features. The light has a wavelength from approximately 420 nanometers to approximately 1,600 nanometers. The method further includes applying a voltage bias to the structure. The method further includes applying to the structure a voltage bias sufficient to convert the structure from the second state to the first state. The second material includes one or more particles in the form of one or more layers. The one or more particles include a core having a first composition, and a layer having a second composition different from the first composition. The second material is encapsulated by the organic material. The organic material includes a conjugated organic material. The device is a non-volatile memory cell or a light sensor.

Other aspects, features and advantages will be apparent from the description of the embodiments thereof and from the claims.

DETAILED DESCRIPTION

Figure 1:
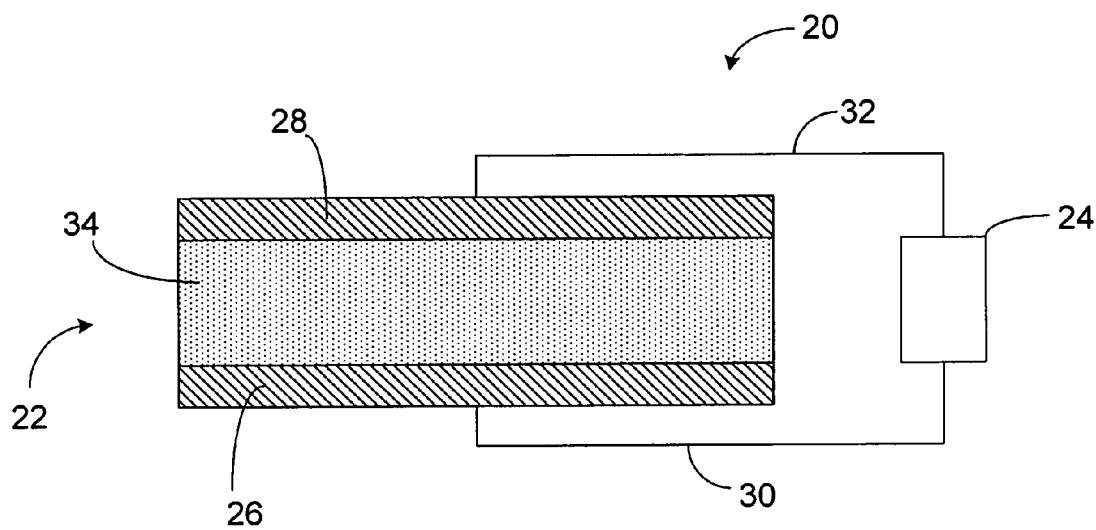
FIG. 1 is a diagrammatic view of an embodiment of a prior art bistable device.
Figure 2:
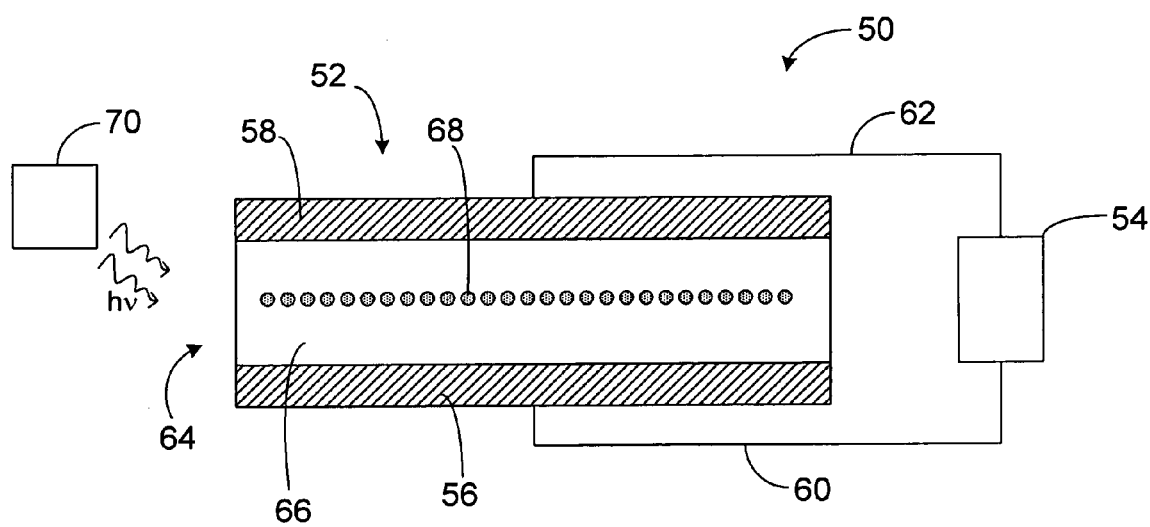
FIG. 2 is a diagrammatic view of an embodiment of a bistable device.

FIG. 2 shows an embodiment of a bistable device 50, which can used to form, for example, optically erasable memory cells or light sensors. Device 50 includes a structure 52 and an electrical power source 54 in electrical communication with the structure. Structure 52 includes a first electrode 56 and a second electrode 58 in electrical communication with electrical power source 54 via connections 60, 62, respectively. Between electrodes 60, 62, structure 52 has a hybrid combination 64 that is capable of exhibiting two states of different electrical resistances. As shown, hybrid combination 64 includes an organic material 66 (such as diindenoperylene) and particles 68 (such as gold nanoclusters) that form a layer embedded in the organic material. Organic material 66 and particles 68 may weakly interact with each other through physisorption. Device 50 further includes a light source 70 that is associated with the device and is capable of delivering or addressing light of selected wavelengths to hybrid combination 64.

Device 50 is capable of converting between two states of different resistances using two different types of energy. For example, the resistance of hybrid combination 64 can be changed from a first resistance state to a second resistance state by applying a predetermined amount of electrical energy to electrodes 56, 58 via electrical power source 54. To convert from the second resistance state to the first resistance state, optical energy can be delivered from light source 70 to hybrid combination 64. For example, hybrid combination 64 can be converted from a high (or low) resistance state to a low (or high) resistance state by applying a predetermined voltage bias across electrodes 56, 58.

Without wishing to be bound by theory, it is believed that a sufficiently high voltage bias generates positive or negative charges (depending on the exact device composition and operation voltages) on particles 68.

Hybrid combination 64 is then capable of being in the low resistance state for an extended period of time until the charges on particles 68 are removed. In embodiments in which device 50 is used to form a memory cell, for example, this charging process can be used to write or to store information (e.g., bit zero or bit one) that is non-volatile until selectively removed. Then, to convert hybrid combination 64 from the low (or high) resistance state to the high (or low) resistance state, light of sufficient energy from light source 70 can be irradiated on the hybrid combination to remove the charges on particles. Without wishing to be bound by theory, it is believed that the light can optically excite organic material 66 to create transiently existing excitons, and subsequently, electron or hole transfer can occur from the upper exciton levels to the charged particles. Additionally, the excitons can dissociate to form negative and positive polarons that transfer charges to the charged particles. During the electron (or hole) transfers, electrical power source 54 and electrodes 56, 58 can deliver current to hybrid combination 64 to restore charge neutrality to organic material 66. In embodiments in which device 50 is used to form a memory cell, for example, this de-charging process can be used to erase previously-stored information. Device 50 can be repeatedly switched between the first and second resistance states as described above.

Still referring to FIG. 2, organic material 66 includes an electronically semi-conducting or conducting organic material capable of being optically excited, such as a conjugated organic material with an optical energy gap larger than approximately 0.5 electron volt. Organic material 66 can include semi-conducting discrete molecules and/or a semi-conducting polymer. In some embodiments, organic material has a composition that cannot be thermally activated under normal operating conditions. Examples of compositions for organic material 66 include p-sexiphenyl, oligophenylenes, polyphenylenes, diindenoperylene (DIP), perylene derivatives, oligothienylenes, polythienylenes, phthalocyanines, porphyrines, oligophenylenevinylenes, polyphenylenevinylenes, oligofluorines, polyfluorines, N,N'-bis-(1-naphthyl)-N,N'-diphenyl 1-1,1-biphenyl 1-4,4'-diamine (and derivatives or polymeric analogs), monoarenes, polyarenes, oligoarenes, and co-polymers containing any of these compositions. Organic material 66 can include a combination of two or more compositions. For example, organic material 66 can include two or more compositions blended together, and/or the organic material can include two or more discrete, unblended compositions.

Particles 68 may include one or more compositions capable of selectively holding charges and selectively releasing charges. Particles 68 can include a transition metal, a main group metal, an alloy, or mixtures thereof. Particles 68 can include metallic conductors and/or semi-conductors, e.g., having a bandgap of from about 0 eV to about 3 eV. The Fermi energy level ($E_f$) of particles 68 is typically within the energy gap ($E_g$) of organic material 66. In some embodiments, the difference in energy between the Fermi energy level ($E_f$) of particles 68 and the highest occupied or lowest unoccupied molecular orbital (HOMO or LUMO) of organic material 66 is approximately 0.3 eV or higher. It is believed that a high difference in energy between the particles' $E_f$ and the organic material's HOMO (or LUMO) can stabilize the charges on the particles to provide non-volatility at room temperature, but more energy may be needed to effect electron transfer from the organic material to the particles. Examples of compositions for particles 68 include gold, aluminum, copper, silver, titanium, platinum, samarium, group IV semiconductors (such as Si and Ge), III-V semiconductors (such as AlN, GaAs, and InSb), II-VI semiconductors (such as ZnS, ZnSe, ZnTe, CdS, CdSe, and CdTe), and composite semiconductors.

The size, shape and distribution of particles 68 can vary. For example, the size of a particle 68 can range from approximately 5 angstroms (or about 10 atoms) to approximately 50 nanometers. A bistable device can include particles 68 having substantially the same size or particles of different sizes. In some embodiments, the size of particles 68 is a function of the composition of the particles and the reproducibility in manufacturing the particles. The shape of particles 68 can be substantially spherical or non-spherical, and structure 52 can include particles of the same shape or different shapes. Particles 68 are typically distributed within organic material 66 such that the particles are spaced as close as possible with each other, but without contacting each other or coalescing together. Particles 68 can be blended with organic material 66, or the particles can be in form of discrete structures, such as a layer located between two layers of the organic material, as shown in FIG. 2. For a layer, particles 68 can be distributed in a concentration of, for example, one particle per approximately 10 nm$^2$ to approximately 1000 nm$^2$. In some embodiments, particles 68 can be blended with organic material 66 and be in the form of discrete structures. For example, structure 52 can include one or more portions in which particles 68 are blended with organic material 66, and one or more portions having one or more layers of particles 68.

Particles 68 can have a composite structure. In some embodiments, particles 68 have a core of a composition described above, and an insulating shell surrounding the core. The insulating shell can include, for example, an oxide (such as native metal oxides (e.g., AgO$_x$, AlO$_x$, CuO$_x$, and TiO$_x$), native semiconductor oxides (e.g., SiO$_x$) or a nitride (e.g., GaN$_x$ and AlN$_x$). Without wishing to be bound by theory, it is believed that the shell can enhance the performance of device 50 by allowing charges to be more stable and localized on the particles, by allowing the device to operate in a wider range of temperatures, and/or by allowing higher currents to be passed through the device. The shell can also enhance processability of structure 52, for example, by interacting with organic material 66 and enhancing the dispersion of particles 68 in the organic material. The shell can have a thickness of approximately 3 to approximately 30 angstroms.

Light source 70 can include a device capable of providing light of sufficient energy to optically excite organic material 66. For example, light source 70 can be a laser or a diode capable of providing light having wavelengths of approximately 420 nanometers to approximately 1,600 nanometers.

Structure 52 can be fabricated using, for example, deposition techniques. Referring still to FIG. 2, electrode 56 can be formed by evaporation or by sputtering an electrically conductive metal or oxide on a substrate. Alternatively, electrode 56 can be made from conducting polymers, such as mixtures of polyethylenedioxythiophene or polyaniline with polystyrenesulfonate. These polymer mixtures can be prepared by solution spin casting or printing techniques. A first portion of organic material 66 can then be deposited on electrode 56 by spin casting or printing techniques (e.g., direct, ink-jet, screen, and/or offset) from solution of the organic material or by thermal evaporation of small conjugated molecules. Particles 68 can be deposited on the first portion of organic material by, for example, thermal evaporation or sputtering of metals (in one or more residual atmospheres), spin casting or printing of soluble functionalized metal nanoclusters/nanoparticles, or by thermal evaporation or spin casting or printing of soluble functionalized semiconductor nanoclusters/nanoparticles. In some embodiments, particles 68 are spaced from electrodes 56, 58 by at least approximately 2 nanometers to prevent the particles from coupling with the electrodes. A second portion of organic material 66 can then be deposited on particles 68 using spin casting, printing or thermal evaporation as indicated above for the first portion. In embodiments, the first and second portions of organic material 66 are free of pinholes, and/or are formed sufficiently thick (e.g., approximately 2-500 nanometers) to reduce the occurrence of an electrical short with electrodes 56, 58 in the event there are defects. Electrode 58 can then be deposited on the second portion of organic material 66 as described above for electrode 56.

Figure 3:
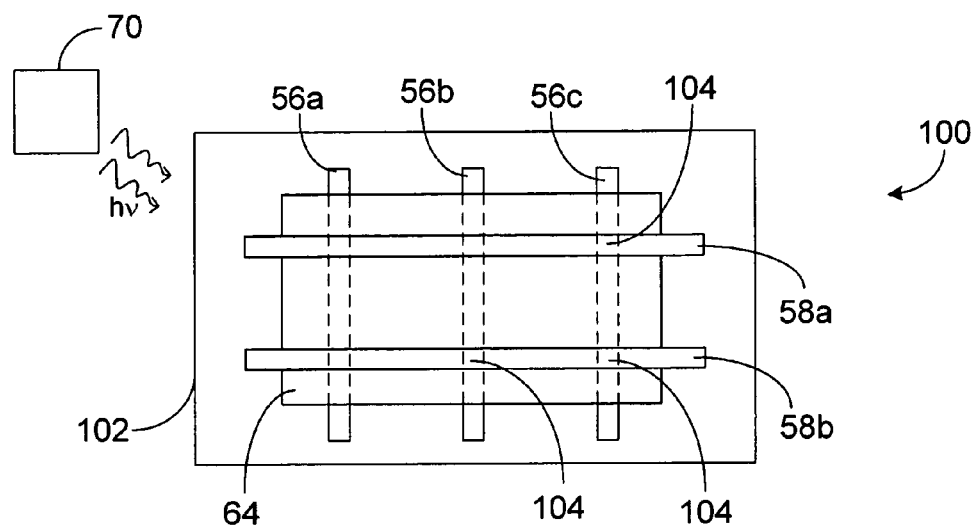
FIG. 3 is a diagrammatic, top view of an embodiment of a memory device.

As indicated above, device 50 can be used in a number of applications, such as a memory cell or a light sensor. For example, FIG. 3 shows a simplified memory device 100 deposited on a substrate 102, such as glass or silicon. Memory device 100 includes a series (as shown, three) of first electrodes 56a, 56b, 56c, and a series (as shown, two) of second electrodes 58a, 58b. Electrodes 56a, 56b, 56c, 58a, 58b are independently connected to an electrical power source (not shown) so that the power source can independently and selectively address each electrode. A hybrid combination 64 in the form of a layer is sandwiched between electrodes 56a, 56b, 56c, 58a, 58b. As a result, device 100 includes six bistable devices at the intersections 104 of first and second electrodes 56a, 56b, 56c, 58a, 58b. Device 100 further includes a light source 70 adapted to independently and selectively provide optical energy to each intersection 104. During use, one or more selected bistable devices can be converted from a first state of resistance to a second state of resistance by providing electrical energy to one or more combinations of electrodes 56a, 56b, 56c, 58a, 58b. To convert the bistable device(s) from the second state of resistance to the first state of resistance, light from light source 70 can be addressed to the appropriate intersection(s) 104.

As another example, bistable device 50 can be used as a light sensor. For example, device 50 can be electrically converted from a first state of resistance to a second state of resistance. Then, when device 50 is exposed to light of sufficient energy, the device is converted from the second state of resistance to the first state of resistance, thereby providing an indication of the light. Other combinations of organic material 66 and particles 68 can be selected to detect light of selected energies and dose.

While a number of embodiments have been described above, the invention is not so limited.

Figure 4:
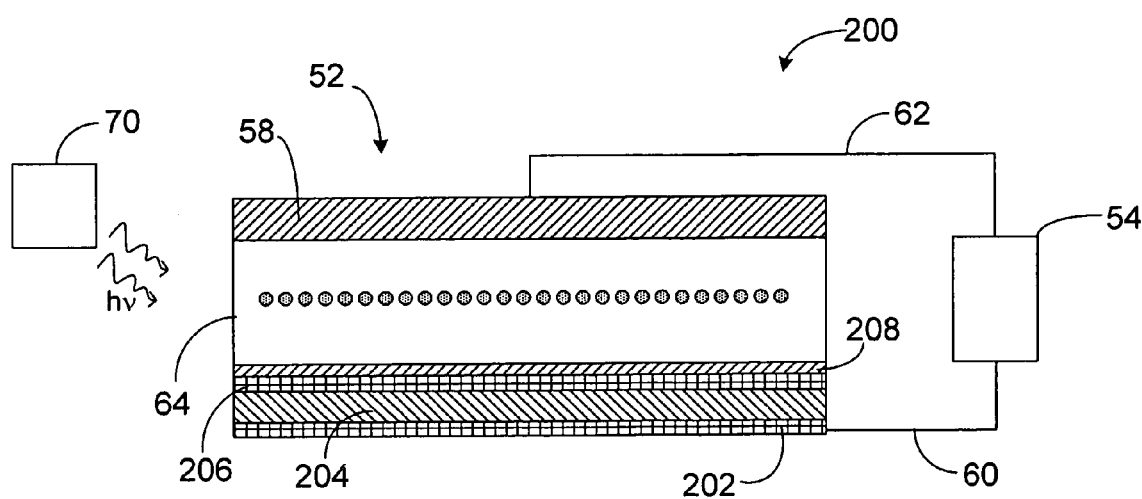
FIG. 4 is a diagrammatic view of an embodiment of a bistable device.

As an example, the bistable devices described herein can be associated with a conventional light emitting diode, which can provide a visual indication of the state of resistance the bistable devices. For example, FIG. 4 shows a bistable device 200 including a layer 202 of indium tin oxide onto which is deposited a layer 204 of poly(2-methoxy-5-(2'ethyl-hexyloxy)-1,4-phenylene vinylene (MEH-PPV) and polyethylene-dioxythiophene/polystyrene-sulfonate (PEDOT/PSS). A thin layer of aluminum 206 and calcium 208 are provided as an electrode. Hybrid combination 64 is provided between calcium layer 208 and electrode 62.

As another example, in some embodiments, hybrid combination 64 includes two or more different compositions for organic material 66. For example, as shown in FIG. 2, the composition of organic material 66 above particles 68 can be different from the composition of organic material 66 below the particles.

All publications, references, applications, and patents referred to herein are incorporated by reference in their entirety.

Other embodiments are within the claims.

What is claimed is:

1. A device, comprising: a structure capable of converting between a first resistance state and a second resistance state by imposing electrical energy to the device, the structure comprising an organic first material and a second material selected from a metal and/or a semi-conductor encapsulated in the organic material; and a light source configured to convert the structure from the second resistance state to the first resistance state.

2. The device of claim 1, wherein the structure further comprises a first electrode and a second electrode, the first and second materials being between the first and second electrodes.

3. The device of claim 1, wherein the first material comprises a conjugated organic material.

4. The device of claim 3, wherein the first material is selected from the group consisting of diindenoperylene, p-sexiphenyl, oligophenylenes, polyphenylenes, diindenoperylene (DIP), perylene derivatives, oligothienylenes, polythienylenes, phthalocyanines, porphyrines, oligophenylenevinylenes, polyphenylenevinylenes, oligofluorines, polyfluorines, N,N'-bis-(1-naphthyl)-N,N'-diphenyl 1-1,1-biphenyl 1-4,4'-diamine, a derivative of N,N'-bis-(1-naphthyl)-N,N'-diphenyl 1-1,1-biphenyl 1-4,4'-diamine, a polymeric analog of N,N'-bis-(1-naphthyl)-N,N'-diphenyl 1-1,1-biphenyl 1-4,4'-diamine, monoarenes, polyarenes, oligoarenes, and co-polymers thereof.

5. The device of claim 1, wherein the second material is selected from the group consisting of gold, aluminum, copper, silver, titanium, platinum, samarium, a group IV semiconductor, a III-V semiconductor, a II-VI semiconductor, and a composite semiconductor.

6. The device of claim 1, wherein the second material is in the form of one or more particles.

7. The device of claim 6, wherein the second material has an average width or diameter of from approximately 5 Angstroms to approximately 50 nanometers.

8. The device of claim 6, wherein the particles comprise a core of a metal and/or a semiconductor that have an insulating shell surrounding the core.

9. The device of claim 1, wherein the second material is in the form of one or more layers.

10. The device of claim 1, wherein the second material comprises at least two different chemical compositions in a core shell configuration.

11. The device of claim 10, wherein the shell comprises an insulator or an organic material.

12. The device of claim 1, wherein the structure further comprises a first electrode and a second electrode, the first and second materials are in the form of layers, the first material being between the second material and one of the electrodes.

13. The device of claim 1, wherein the light source is capable of providing light having a wavelength from approximately 420 nanometers to approximately 1,600 nanometers.

14. The device of claim 1, in the form of a non-volatile memory cell.

15. The device of claim 1, in the form of a light sensor.

16. A device, comprising: a structure capable of converting between a first resistance state and a second resistance state, the structure comprising a first electrode, a second electrode, an organic material between the first and second electrodes, and one or more particles between the first and second electrodes, the one or more particles selected from a metal and/or a semi-conductor encapsulated in the organic material; and a light source configured to convert the structure from the first resistance state to the second resistance state, the light source being capable of providing light having a wavelength from approximately 420 nanometers to approximately 1,600 nanometers.

17. The device of claim 16, wherein the one or more particles are in the form of one or more layers.

18. The device of claim 16, wherein the one or more particles comprise a core of a metal and/or a semi-conductor, and an insulating layer surrounding the core.

19. The device of claim 16, wherein the organic material comprises a conjugated organic material.

20. The device of claim 16, further comprising a second device capable of providing an electrical voltage across the first and second electrodes.

21. The device of claim 16, in the form of a non-volatile memory cell or a light sensor.

22. A method of using a device, comprising: providing a structure capable of converting between a first resistance state and a second resistance state, the structure comprising an organic first material and a second material different from the first material in which the second material is selected from a metal and/or a semi-conductor encapsulated in the first material; and addressing the structure with electrical energy sufficient to convert the structure from the first resistance state to the second resistance state and addressing the structure with light sufficient to convert the structure from the second resistance state to the first resistance state.

23. The method of claim 22, wherein the light has a wavelength from approximately 420 nanometers to approximately 1,600 nanometers.

24. The method of claim 22, in which the electrical energy comprises a voltage bias to the structure.

25. The method of claim 22, wherein the second material comprises one or more particles in the form of one or more layers.

26. The method of claim 25, wherein the one or more particles comprise a core of a metal and/or a semi-conductor, and an insulating layer surrounding the core.

27. The method of claim 22, wherein the organic material comprises a conjugated organic material.

28. The method of claim 22, wherein the device is a non-volatile memory cell or a light sensor.

* * * * *